July 5, 1966 F. M. BRAUER 3,259,851

DIGITAL SYSTEM FOR STABILIZING THE OPERATION OF
A VARIABLE FREQUENCY OSCILLATOR

Filed Nov. 1, 1961 2 Sheets-Sheet 1

INVENTOR.
FRANK M. BRAUER.
BY Alden D. Redfield
Irwin P. Garfinkle
ATTORNEYS.

July 5, 1966 F. M. BRAUER 3,259,851

DIGITAL SYSTEM FOR STABILIZING THE OPERATION OF
A VARIABLE FREQUENCY OSCILLATOR

Filed Nov. 1, 1961 2 Sheets-Sheet 2

INVENTOR
FRANK M. BRAUER

United States Patent Office 3,259,851
Patented July 5, 1966

3,259,851
DIGITAL SYSTEM FOR STABILIZING THE OPERATION OF A VARIABLE FREQUENCY OSCILLATOR

Frank M. Brauer, Cincinnati, Ohio, assignor to Avco Corporation, Cincinnati, Ohio, a corporation of Delaware Filed Nov. 1, 1961, Ser. No. 149,399
6 Claims. (Cl. 331—14)

This invention relates to stable frequency signal generators generally, and more particularly to a digital system in which frequency error is determined by counting the number of cycles generated in a given period.

In many applications, particularly in single sideband and other very narrow channel tuned communication equipment systems, it is necessary to provide a variable frequency oscillator capable of generating many closely spaced, highly stabilized frequencies. The system provided by the present invention incorporates a frequency standard generator for generating a fixed time gate during which the output frequency of a variable frequency oscillator is compared with a preset value. Any frequency error is digitally detected and then integrated and applied to control circuits to adjust the frequency of operation of the variable frequency oscillator. This system produces highly stable output frequencies with accuracies equivalent to that of the standard and with minimum hunting.

It is the primary purpose of this invention to obtain the maximum number of very stable frequencies from a frequency standard, approaching to a practical extent a self-stabilizing variable frequency oscillator.

Another object of this invention is to provide a stable frequency signal generator which provides essentially infinite frequency resolution.

Another object of this invention is to provide a highly stable variable frequency oscillator having self-adjusting ability which corrects for frequency drift automatically.

Figure 1:
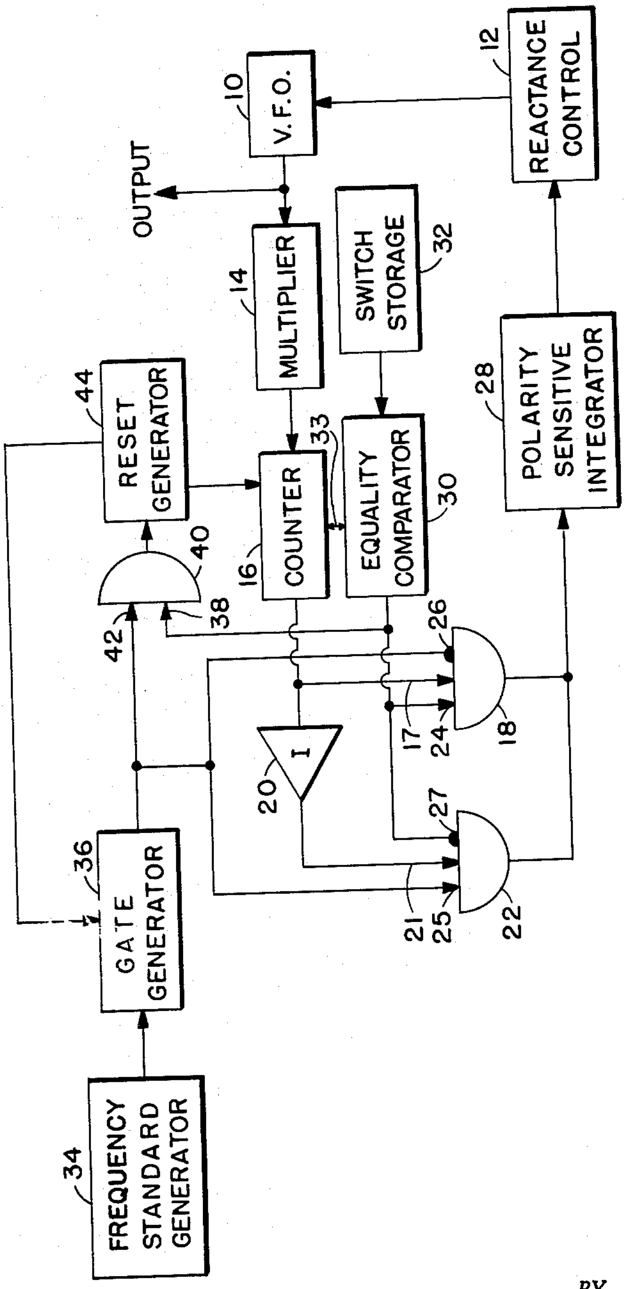
Figure 2:
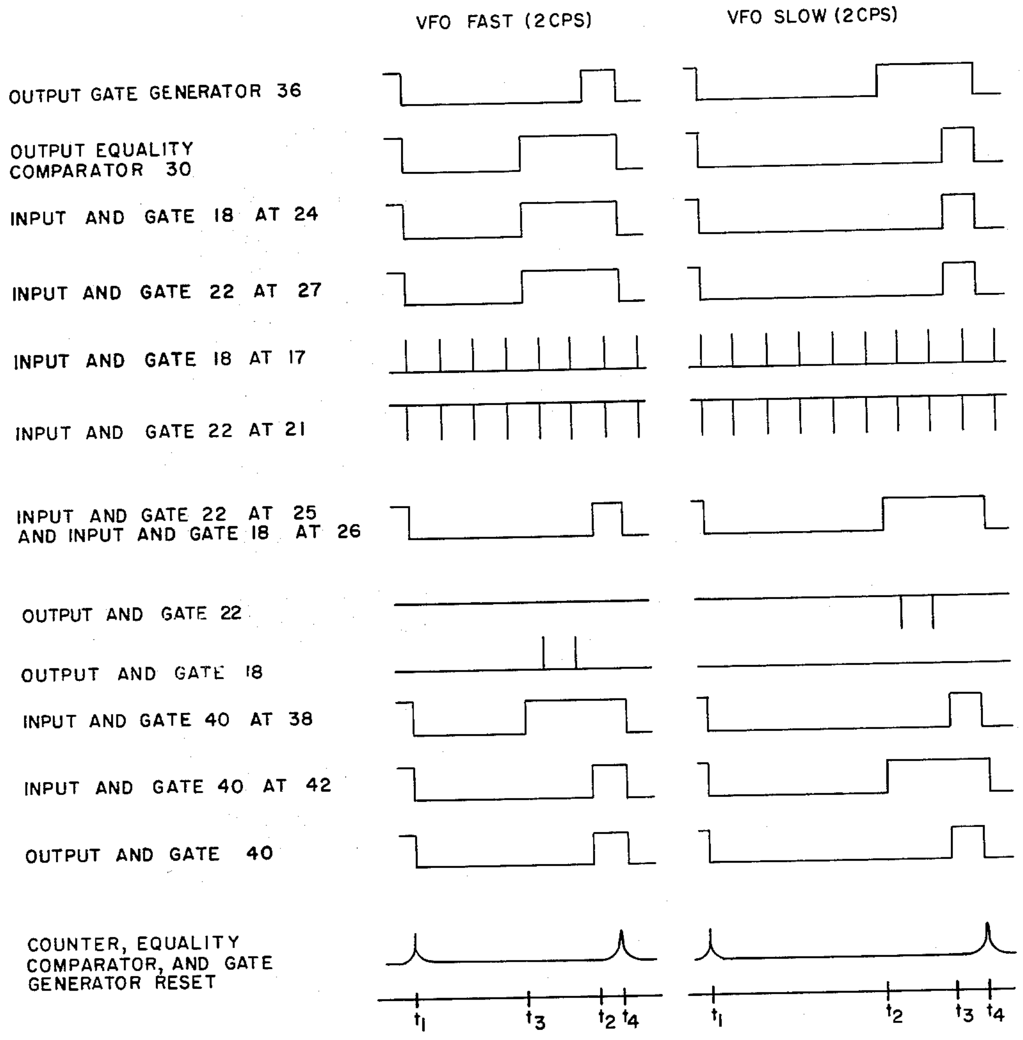

For other objects and for a better understanding of the precise nature of this invention, reference should now be made to the accompanying drawing in which FIGURE 1 represents a preferred embodiment of the invention, and FIGURE 2 is a series of curves showing the sequence of events in the embodiment of FIGURE 1.

The apparatus provided includes a conventional variable frequency oscillator 10, and it is the purpose of the invention to derive from the output of this oscillator a very large number of highly stabilized frequencies. A reactance control device 12 is connected in the input circuit of the oscillator 10, and upon the application of a direct voltage it serves to change the oscillator impedance to adjust for frequency. It will be understood that the variable frequency oscillator 10 includes means for switching the frequency to a coarse setting, while the reactance control device 12 is connected in the servo loop of this invention to provide fine control.

A portion of the output from the variable frequency oscillator 10 is applied through a multiplier 14 to a counter 16, having the usual binary counting circuits. Preferably the counter 16 is provided with a visual display for indicating the actual count. The output from the counter 16, which constitutes a series of pulses of one polarity having a repetition rate equal to the multiplier frequency, is supplied directly to the terminal 17 of a first AND gate 18, and through a polarity inverter 20 to the terminal 21 of a second AND gate 22. For each pulse applied to the counter, a pulse appears in its output and is passed through gates 18 or 22 upon the application of appropriate signals to the second terminals 24 or 25, provided the gates are uninhibited at the inhibit terminals 26 and 27, respectively. The output pulses of the gates 18 or 22 are then applied to a polarity sensitive integrator 28 which serves to drive the reactance control device 12 in the input circuit of the variable frequency oscillator 10.

The appropriate signals for controlling the operation of the AND gates 18 and 22 are provided by means of (1) an equality comparator 30 which is set up by a switch storage device 32, and (2) by means of a frequency standard generator 34, the output of which serves to control a gate generator 36 for generating a gate having a fixed predetermined time interval.

The desired system frequency is set into the comparator 30 by manual or automatic operation of the switch storage device 32. It will be understood that the comparator 30 contains usual counting circuits and the switch 32 is set to establish binary circuits for the desired frequency, and preferably it is provided with a visual display of the desired frequency. Connections from the binary circuits in the counter 16 through a plurality of lines (indicated at 33) to the binaries in the comparator 30 permit a comparison of the preset frequency of the comparator 30 with the actual count of the counter 16. When equality exists, the comparator output changes state. The equality comparator 30 is set up so that it will have an output of zero until such time as the frequency set into it has been counted in the counter 16, at which time the comparator output will flip to the other state, and the output of the comparator will remain in that condition until the counter 16 is reset. The output voltage of the equality comparator 30 is supplied to both AND gates, at the second terminal 24 of AND gate 18, and at the inhibitor 27 of AND gate 22.

The output voltage from the gate generator 36 is also zero or one, and this output is also applied to both AND gates, at the second terminal 25 of AND gate 22, and at the inhibitor 26 of AND gate 18.

One condition of the output of the equality comparator 30, for example one, serves to inhibit the AND gate 22 at the inhibitor 27, but serves to enable the AND gate 18 at the terminal 24. On the other hand, a gate voltage (for example one) from the gate generator 36 serves to inhibit the AND gate 18 at the inhibitor 26, but serves to enable the AND gate 22 at the terminal 25.

If the AND gate 18 is uninhibited before the AND gate 22, then pulses of one polarity will be applied to the polarity sensitive integrator 28 to drive the reactance control device 12 in one direction. If the AND gate 22 is uninhibited first, then because of the inverter 20, voltage pulses of opposite polarity are produced at the integrator 28 for driving the reactance control device 12 in the opposite direction.

Now it will be recalled that the output of equality comparator 30 changes state at the instant when the number of pulses set up in the comparator 30 by the switch storage device 32, has been counted in the counter 16. That is, when the binaries in the counter 16 are in equality with the binary setting of the comparator 30, the comparator changes state. If the variable frequency oscillator 10 is operated at exactly the right frequency, the period of time for counting the frequency set into the comparator will be exactly equal to the time period of the gate generated by the gate generator 36. Under these conditions both gates would each be inhibited at the terminals 26 and 27, respectively, and no error voltage is developed.

If the variable frequency oscillator 10 is running too fast, then the counter 16 will reach equality too soon and the comparator 30 will change state before the time gate expires. This enables the AND gate 18, but inhibits the AND gate 22 at the inhibit terminal 27 and permits the passage of the counter output through the AND gate 18 to the polarity sensitive integrator 28. If the variable frequency oscillator 10 is slow, then the gate voltage from the generator 36 will terminate prior to the comparator 30 and counter 16 reaching equality. Termination of the gate voltage will enable the AND gate 22, but inhibits AND gate 18 at the inhibit terminal 26, thereby permitting the passage of the inverted counter pulses to the polarity sensitive integrator 28. In either event, the number of pulses passed through the gate 18 or 22, in a positive or negative sense, to the polarity sensitive integrator 28 will be a digital function of the frequency error of the variable frequency oscillator 10, and the reactance control device 12 will be driven by an amount and in a direction tending to correct the frequency of operation of the oscillator 10.

To reset the apparatus to start a subsequent sampling and correction of the frequency, the output of the equality comparator 30 is connected to one terminal 38 of an AND gate 40 while the output from the gate generator 36 is connected to the other terminal 42. AND gate 40 is a conventional AND gate developing an output which may be either zero or one (a one is illustrated in the example of FIGURE 2) when two input signals are applied to the terminals 38 and 40. The input signals to the AND gate 40 comprise the outputs from the gate generator 36 and the equality comparator 30. The AND gate 40 develops its one output voltage when the output from the gate generator 36 changes state at the termination of the gate and when the equality comparator changes state at the completion of the equality count. The output of AND gate 40 is applied to a reset generator 44 having a first output connected to reset the gate generator 36, and a second output connected to reset the counter 16. Thus at the termination of the gate output from gate generator 36, and when the equality comparator 30 changes state, an output is produced at the AND gate 40 to activate the reset generator 44. The output from the reset generator 44 serves to reset the gate generator 36 to start another gate from the gate generator 36 and to reset the counter 16 to zero. At this point the equality comparator 30 is again not at equality with the counter 16 and its output again changes state. As seen in FIGURE 2, the gate generator output and the equality comparator output are reset to zero; however, the only requisite is that each be reset to a disabling condition for the gates 22 and 18, respectively.

Depending on the short-term stability of the variable frequency oscillator 10, it is desirable to sample it frequency at as rapid a rate as possible. On one designed embodiment of this invention, a frequency of operation in the 6 megacycle range was used, and it was found that the fastest practical sampling rate was 16 times per second. Thus the duration of the gate generator output pulse was set at $\frac{1}{16}$ second. In order to detect errors on a cycle-for-cycle basis, the multiplier 14 multiplied the sampled frequency of the variable frequency oscillator 10 by a fractor of 16, and thus the number of pulses applied to the counter 16 during the period of the gate of generator 36 ($\frac{1}{16}$ second) is exactly equal to the number of cycles generated in one second by the variable frequency oscillator 10. This arrangement permits cycle-for-cycle comparison of the counter 16 with the setting of the equality comparator 30. By increasing the multiplication factor of the multiplier 14, accuracies may be achieved down to any decimal place and errors of fractions of cycles may be detected and corrected.

It will be observed that the quantity of charge delivered from the counter 16 to the integrator 28 (treated as an open loop) is directly proportional to the frequency error significant to one count of the counter 16. The attribute of the system limits the tendency of the corrective means to over shoot the selected frequency of the variable frequency oscillator 10. Another attribute of this invention is that the visual display of the counter 16 provides a direct indication of the actual running frequency of operation. In addition, the visual display of the equality comparator shows the desired frequency of operation, and visual comparison of the running frequency with the desired frequency set into the comparator provides a simple means for indicating system performance and reliability.

To better understand the invention, a sequence of operation will now be described in connection with FIGURE 2 where two conditions are shown—one where the variable frequency oscillator is operating two cycles per second too fast, and the other where the variable frequency oscillator is operating two cycles per second too slow. In both cases the AND gates 22 and 18 are initially disabled by the zero outputs of the comparator 30 and generator 36, respectively. Also in both cases, the gate voltage, as developed by the output of the gate generator 36, runs for a period starting at time $t_1$ and ending at time $t_2$, a fixed period of time determined by the standard frequency generator 34. Since the variable frequency oscillator is running two cycles per second too fast, the counter 16 reaches equality and changes state at time $t_3$, which in this case is prior to time $t_2$ by two cycles. At time $t_3$ the one output of the equality comparator 30 is applied to the terminal 27 of AND gate 22 and to the terminal 24 of AND gate 18. This enables the AND gate 18 but inhibits the AND gate 22.

In the meantime, pulses from the counter 16 have been applied directly to the AND gate 18 and to the AND gate 22 through the inverter 20. Since the AND gate 18 is uninhibited at time $t_3$, pulses are permitted to pass through the AND gate 18 until time $t_2$ when the output of the gate generator 36 changes state (to a one voltage) and inhibits AND gate 18.

It will also be noted that AND gate 40 is now provided with the one voltage outputs of both the equality comparator 30 and the gate generator 36, permitting a one output voltage from the AND gate 40 to the reset generator 44. The output from the reset generator 44 at time $t_4$ is a pulse which serves to reset the counter 16 and the gate generator 36 to start another cycle.

Now consider the example where the variable frequency oscillator is going two cycles too slow. In this case the output of gate generator 36 will change state at time $t_2$ before the output of equality comparator 30 changes state at time $t'_3$. The termination of the gate voltage, i.e., the change in state of the output of gate generator 36 from a zero voltage to a one voltage, enables the AND gate 22 but inhibits the AND gate 18, thereby permitting the passage of the pulses applied to the AND gate 22 through the inverter 20. Thus, negative pulses will pass through the AND gate 22 until time $t'_3$ when the change of state of the equality comparator 30 inhibits AND gate 22. The reset will occur in the same manner described above.

Various modifications and adaptations of this invention will be apparent to persons skilled in the art, and for that reason it is intended that this invention be limited only by the annexed claims as interpreted in the light of the prior art.

What is claimed is:

1. In a system for generating a plurality of frequency stabilized oscillations, the combination comprising:
- a variable frequency oscillator for generating a preselected number of cycles during a given time period;
- a reactance control device connected to said oscillator for adjusting the frequency of said oscillator in response to the application of an error signal;
- a counter for counting the number of cycles generated by said oscillator and for generating a direct voltage pulse for each cycle counted;
- first and second closed gates, each having an input circuit and an output circuit;
- means for applying said pulses to the input circuit of each of said closed gates, the polarity of the pulses applied to one of said gates being inverted;
- a polarity sensitive device for generating an error voltage having a magnitude and a polarity dependent on the number and polarity of the pulses applied it, said device being connected to the output circuits of said gates;
- means responsive to the counting of said cycles during a given period for opening the first of said gates when the number of said cycles is less than said preselected number, whereby pulses of one polarity are applied to said device to produce error signals of one polarity;
- means responsive to counting of said cycles during a given period for opening the second of said gates when the number of said cycles is greater than said preselected number, whereby pulses of the opposite polarity are applied to said device to produce error signals of the opposite polarity;
- and means applying said error signals to said reactive control device.

2. In a servo system for controlling the frequency of operation of a variable frequency oscillator, the combination comprising:
- a variable frequency oscillator including circuitry for approximately tuning to a preselected frequency;
- a reactance control device connected to said circuitry for precisely adjusting the frequency of operation of said oscillator to said preselected frequency, said reactance control device being responsive to the application of an error signal;
- a counter for counting the number of cycles generated by said variable frequency oscillator and for producing a counter pulse of one polarity for each cycle counted;
- first and second inhibited AND gates, each having first and second input terminals, an inhibit terminal and an output terminal;
- a polarity inverter;
- a polarity sensitive pulse integrator for developing an error signal having a magnitude and polarity dependent on the number and the polarity of the pulses applied to it, said pulse integrator being connected to the output terminal of each of said gates;
- means connecting said counter pulses to said polarity sensitive pulse integrator, said means including a direct connection from the output of said counter to the first terminal of said first gate, and a connection from the output of said counter to the first terminal of said second gate through said polarity inverter;
- an equality comparator connected to said counter, said equality comparator being settable to said preselected frequency, the output voltage of said equality comparator being in a first state when the number of cycles counter by said counter is not equal to the preselected frequency, and in a second state when the number of cycles counted by said counter is equal to or greater than the preselected frequency;
- means connecting said output voltage of said equality comparator to said inhibit terminal of said second gate to inhibit said second gate, and to the second terminal of said first gate to enable said first gate;
- a gate generator for generating a gate voltage in one state for a given period, and in another state after said period;
- means connecting said gate voltage to the second terminal of said second gate to enable said second gate and to the inhibit terminal of said first gate to inhibit said first gate during said period;
- and means connecting said error signal to said reactance control device for adjusting the frequency of said variable frequency oscillator.

3. The invention as defined in claim 2 and reset means for continuously recounting said cycles for continuously adjusting the frequency of operation of said variable frequency oscillator.

4. The invention as defined in claim 3 wherein said reset means comprises a reset generator for producing a reset voltage output in response to a signal;
- means in said counter responsive to said reset voltage for resetting said counter to zero;
- and means in said gate generator responsive to said reset voltage for initiating said gate voltage in said one state.

5. The invention as defined in claim 4 wherein the means for producing said signal comprises a third AND gate having first and second input terminals and an output terminal;
- a connection from said gate generator to said first terminal for enabling said third AND gate at the termination of said period;
- and a connection from said equality comparator to said second terminal to enable said AND gate when the number of cycles counted is equal to the preselected frequency.

6. In a servo system for controlling the frequency of operation of a variable frequency oscillator, the combination comprising:
- a variable frequency oscillator including circuitry for approximately tuning to a preselected frequency for generating a given number of cycles during a given period;
- a reactance control device connected to said circuitry for precisely adjusting the frequency of operation of said oscillator to said preselected frequency, said reactance control device being responsive to the application of an error signal;
- a multiplier having a frequency output equal to N times said frequency of operation of said oscillator, where N is any number;
- a counter for counting the number of cycles generated by said multiplier and for producing a counter pulse of one polarity for each cycle counted;
- first and second inhibited AND gates, each having first and second input terminals, an inhibit terminal and an output terminal;
- a polarity inverter;
- a polarity sensitive pulse integrator for developing an error signal having a magnitude and polarity dependent on the number and the polarity of the pulses applied to it said pulse integrator being connected to the output terminal of each of said gates;
- means connecting said counter pulses to said polarity sensitive pulse integrator, said means including a direct connection from the output of said counter to the first terminal of said first gate, and a connection from the output of said counter to the first terminal of said second gate through said polarity inverter;
- an equality comparator connected to said counter, said equality comparator being settable to said preselected frequency, the output voltage of said equality comparator being in a first state when the number of cycles counted by said counter is less than the preselected frequency, and in a second state when the number of cycles counted by said counter is equal to or greater than the preselected frequency;

means connecting said output voltage of said equality comparator to said inhibit terminal of said second gate to inhibit said gate, and to the second terminal of said first gate to enable said first gate;

a gate generator for generating a gate voltage in one state for a gated period equal to $1/N$ times said given period, and in another state thereafter;

means connecting said gate voltage to the second terminal of said second gate to enable said second gate and to the inhibit terminal of said first gate to inhibit said first gate during said period;

and means connecting said error signal to said reactance control device for adjusting the frequency of said variable frequency oscillator.

References Cited by the Examiner

UNITED STATES PATENTS 2,490,500 12/1949 Young ---------------- 331—25

FOREIGN PATENTS 839,422 6/1960 Great Britain.

ROY LAKE, *Primary Examiner.*

JOHN KOMINSKI, S. H. GRIMM, *Assistant Examiners.*